(12) United States Patent
Elgani et al.

(10) Patent No.: US 11,342,885 B2
(45) Date of Patent: May 24, 2022

(54) DETECTION CIRCUIT, CORRESPONDING DEVICE AND METHOD

(71) Applicant: STMicroelectronics S.r.l., Agrate Brianza (IT)

(72) Inventors: Alessia Maria Elgani, Pavia (IT); Francesco Renzini, Urbino (IT); Luca Perilli, Teramo (IT); Eleonora Franchi Scarselli, Bologna (IT); Antonio Gnudi, Bologna (IT); Roberto Canegallo, Rimini (IT); Giulio Ricotti, Broni (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 238 days.

(21) Appl. No.: 16/698,060

(22) Filed: Nov. 27, 2019

(65) Prior Publication Data
US 2020/0177133 A1 Jun. 4, 2020

(30) Foreign Application Priority Data

Dec. 4, 2018 (IT) .......................... 102018000010793

(51) Int. Cl.
*H03F 1/02* (2006.01)
*H03D 1/10* (2006.01)
(Continued)

(52) U.S. Cl.
CPC ............ *H03F 1/0222* (2013.01); *H03D 1/10* (2013.01); *H03D 1/18* (2013.01); *H03F 3/1935* (2013.01);
(Continued)

(58) Field of Classification Search
CPC .................................................. H03F 1/0222
See application file for complete search history.

(56) References Cited

U.S. PATENT DOCUMENTS 6,167,310 A * 12/2000 Grevious ........... A61N 1/37252
607/32
9,601,995 B1 3/2017 Mukherjee et al.
(Continued)

FOREIGN PATENT DOCUMENTS

WO 2018025324 A1 2/2018

OTHER PUBLICATIONS

Abidi, Asad A., et al., "Power-Conscious Design of Wireless Circuits and Systems", Proceedings of the IEEE, vol. 88, No. 10, Oct. 2000, pp. 1528-1545.
(Continued)

*Primary Examiner* — Patricia T Nguyen
(74) *Attorney, Agent, or Firm* — Slater Matsil, LLP

(57) ABSTRACT

In one example, a circuit includes a first node to receive an analog signal that is an amplitude modulated radio-frequency signal for a digital signal. An output node is configured to provide an output signal indicative of rising and falling edges of an envelope of the analog signal. The rising and falling edges are indicative of rising and falling edges of the digital signal. A first current path is disposed between a power supply node and the first node. The first current path includes a first transistor coupled between the first node and a first bias source. The first bias source is coupled between the first transistor and the power supply node. The output node is coupled to a first intermediate node in the first current path between the transistor and the first bias source. A control terminal of the first transistor is coupled to the output node via a feedback network.

20 Claims, 4 Drawing Sheets

(51) Int. Cl.
*H03D 1/18* (2006.01)
*H03F 3/193* (2006.01)

(52) U.S. Cl.
CPC ............... *H03D 2200/0043* (2013.01); *H03F 2200/102* (2013.01); *H03F 2200/451* (2013.01)

(56) References Cited

U.S. PATENT DOCUMENTS

| | | | |
|---|---|---|---|
| 10,732,281 B2* | 8/2020 | LaChapelle | G01S 7/497 |
| 2006/0255860 A1 | 11/2006 | Moussavi | |
| 2007/0249304 A1* | 10/2007 | Snelgrove | H03F 3/191 |
| | | | 455/127.2 |
| 2011/0235689 A1* | 9/2011 | Kousai | H04L 27/2601 |
| | | | 375/219 |
| 2013/0271124 A1* | 10/2013 | Kirkpatrick | G01R 33/0035 |
| | | | 324/251 |
| 2014/0184334 A1 | 7/2014 | Nobbe et al. | |
| 2015/0070095 A1 | 3/2015 | Cabanillas et al. | |
| 2019/0190450 A1 | 6/2019 | Ikeda et al. | |
| 2020/0256961 A1* | 8/2020 | Gaalema | G01S 17/93 |

OTHER PUBLICATIONS

Wang, Po-Han Peter, et al., "A Near-Zero-Power Wake-Up Receiver Achieving -69-dBm Sensitivity", IEEE Journal of Solid-State Circuits, vol. 53, No. 6, Jun. 2018, pp. 1640-1652.

Makhsuci, Saeedeh, et al., "Oscillation-based Test for Measuring 1dB Gain Compression Point of Power Amplifiers", 26th Iranian Conference on Electrical Engineering (ICEE2018), May 8, 2018, pp. 190-195.

Roberts, Nathan E., et al., "A 98nW Wake-Up Radio for Wireless Body Area Networks", RTU2A-1, 2012 IEEE Radio Frequency Integrated Circuits Symposium, Jun. 17, 2012, pp. 373-376.

Wang, Yao, et al., "A Novel Envelope Edge Detector for Ultra-low Power Sensor Wake-up Circuit", 2013 IEEE Symposium on Low Power Electronics and Design, Sep. 4-6, 2013, 6 pages.

Reyes, Linder, et al., "Analysis and Design of a MOS RF Envelope Detector in All Inversion Regions", Symposium on Integrated Circuits and Systems Design (SBCCI), Aug. 31, 2015, 5 pages.

* cited by examiner

DETECTION CIRCUIT, CORRESPONDING DEVICE AND METHOD

CROSS-REFERENCE TO RELATED APPLICATIONS

This application claims priority to Italian Patent Application No. 102018000010793, filed on Dec. 4, 2018, which application is hereby incorporated herein by reference.

TECHNICAL FIELD

The present invention relates generally to detection circuits, and, in particular embodiments, to detection circuit, corresponding device and method.

BACKGROUND

Envelope detection of analog signals is a well-known technique which may be used for reconstructing digital information (e.g., a sequence of bits) from a radio frequency (RF) modulated analog signal.

For instance, on-off keying (OOK) is a simple form of amplitude-shift keying (ASK) modulation that may represent digital data at the presence or absence of a carrier wave in an analog signal. In the simplest form of on-off keying modulation, the presence of a carrier wave for a certain duration represents a binary one, while its absence for the same duration represents a binary zero. In other cases, some more sophisticated schemes may convey additional information, e.g. varying these durations.

For instance, FIG. 1 is exemplary of a digital signal $V_{OOK}(t)$ representing a certain sequence of binary values (bits), wherein a low logic value (e.g., 0 V) of signal $V_{OOK}(t)$ is indicative of a binary zero, and a high logic value (e.g., a power supply voltage $V_{dd}$) of signal $V_{OOK}(t)$ is indicative of a binary one. It will be understood that the binary sequence 0100111010 . . . illustrated in FIG. 1 is purely exemplary of a possible behavior of a digital signal over time.

Applying on-off keying modulations to signal $V_{OOK}(t)$ may produce a radio frequency modulated signal $v_{RF}(t)$ as exemplified in FIG. 1, wherein a possible relationship between signals $V_{OOK}(t)$ and $v_{RF}(t)$ is exemplified by the following equation:

$$v_{RF}(t) = V_{OOK}(t) \cdot \cos(\omega t) \qquad (1)$$

According to equation (1) above, the peak amplitude of the RF-modulated signal $v_{RF}(t)$—when present—may be equal to the voltage level of the high logic value of signal $V_{OOK}(t)$, e.g. a power supply voltage $V_{dd}$.

Generally, a modulation circuit which generates a signal $v_{RF}(t)$ from a signal $V_{OOK}(t)$ may also involve a gain factor, so that the RF-modulated signal $v_{RF}(t)$ may have a peak amplitude—referred to as $A_{RF,in}$ throughout the present description—different from the amplitude of signal $V_{OOK}(t)$. Thus, the peak-to-peak amplitude of signal $v_{RF}(t)$ will be equal to $2*A_{RF,in}$, as illustrated in FIG. 1.

Applying envelope detection to signal $v_{RF}(t)$ may generate an envelope signal $v_{out}(t)$ as exemplified in FIG. 1, which is indicative of the information conveyed by the digital signal $V_{OOK}(t)$.

Therefore, envelope detection may be used in receiver circuits (e.g., of the type used in wireless sensor nodes) for de-modulating amplitude-modulated received signals, such as signals $v_{RF}(t)$ as exemplified in FIG. 1.

When considering low-power applications, various circuit topologies are known in the art for realizing envelope detection of signals, e.g. in the context of OOK-modulated signals.

For instance, the following documents are exemplary of the prior art:

P. Wang et al., "A Near-Zero-Power Wake-Up Receiver Achieving −69-dBm Sensitivity", IEEE Journal of Solid-State Circuits 2018, vol. 53, no. 6, June 2018, pp. 1640-1652;

N. Roberts et al., "A 98 nW Wake-Up Radio for Wireless Body Area Networks", 2012 IEEE Radio Frequency Integrated Circuits Symposium, June 2012, pp. 373-376;

Y. Wang et al., "A Novel Envelope Edge Detector for Ultra-low Power Sensor Wake-Up Circuit", Proceedings of the 2013 IEEE International Symposium on Low Power Electronics and Design (ISLPED), September 2013, pp. 371-376; and P. Wang et al., "A 400 MHz 4.5 nW −63.8 dBm Sensitivity Wake-up Receiver Employing an Active Pseudo-Balun Envelope Detector", ESSCIRC 2017—43rd IEEE European Solid State Circuits Conference, Leuven, 2017, pp. 35-38.

SUMMARY

Despite the extensive activity in the area, further improved solutions are desirable.

For instance, solutions are desirable for detecting the envelope of RF-modulated signals, in particular for detecting edges of the envelope of RF-modulated signals, preferably both rising and falling edges. Detecting edges of an envelope may facilitate band-pass operation of an envelope detection circuit, which may thus result in the cutting of noise bandwidth and therefore integrated noise.

Solutions are desirable which may provide an envelope detection circuit including an input stage comprising a common-gate circuit topology. A common-gate input stage may facilitate operation at higher RF frequencies, e.g. as a result of a lower input capacitance, compared to solutions relying on a common-source input stage.

Solutions are desirable which may not involve complex biasing circuit arrangements, e.g. providing an envelope detection circuit comprising a self-biasing circuit network.

Solutions are desirable which may facilitate AC coupling to subsequent stages. Solutions with AC coupling between stages may be desirable insofar as such solutions may not require a common DC operating point robust to possible PVT variations which may perturb the theoretical DC operating point.

Also, solutions are desirable which may not involve complex calibration procedures and may be robust, e.g. with respect to possible PVT variations.

Additionally, solutions are desirable which may be adapted to de-modulate analog signals carrying digital information at different bit rates, e.g. providing a sort of "bit rate programmability" of the envelope detection circuit.

Specifically, solutions are desirable which may be implemented with standard complementary metal-oxide semiconductor (CMOS) processes.

One or more embodiments contribute in providing such improved solutions.

According to one or more embodiments, these are achieved by an (integrated) circuit having the features set forth in the claims that follow.

One or more embodiments may relate to a corresponding device. A device comprising an envelope detection circuit and an RF antenna coupled thereto may be exemplary of such a device.

One or more embodiments may relate to a corresponding method of operating such circuit and/or device.

The claims are an integral part of the technical teaching provided herein in respect of the embodiments.

One or more embodiments may relate to a circuit including an input stage comprising a common-gate circuit topology operating in sub-threshold regime, and a negative feedback network comprising a low-pass filter for self-biasing, e.g. for setting the DC operating point of the circuit.

One or more embodiments may comprise a source follower in the feedback network to provide an output signal indicative of edges of the envelope of a received analog signal.

One or more embodiments may comprise a capacitor between the common-gate input stage and the source follower in the feedback network, e.g. to tune the filtering properties of the envelope detection circuit.

In one or more embodiments the input stage may comprise a cascoded common-gate circuit arrangement.

Always-on nano-Watt Wake-Up radios, e.g. for short range communication, represent a possible application where the advantages of one or more embodiments may be appreciated.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

The description relates to detection circuits. One or more embodiments may be applied to low-power circuits, e.g. integrated ultra low-power circuits. One or more embodiments may be applied to envelope detection circuits, e.g. for use in wake-up circuits of ultra low-power sensors. For instance, one or more embodiments may be applied in wireless sensor nodes of wireless sensor networks (WSN), e.g. for providing increased battery life of sensor nodes.

The inventors have observed that prior approaches described above have several drawbacks.

For instance, both solutions proposed by P. Wang et al. (2017 and 2018) require a complex circuit arrangement to correctly set the DC operating point despite possible process, voltage and temperature (PVT) variations and random mismatches between different transistors which may perturb the theoretical DC operating point.

The solution proposed by N. Roberts et al. is based on a differential circuit architecture, which may be negatively affected by possible mismatch and/or asymmetry issues, such as random mismatches between corresponding transistors in the two branches of the differential circuit.

The solution proposed by Y. Wang et al. requires complex calibration and only detects falling edges in the input digital signal.

Figure 2:
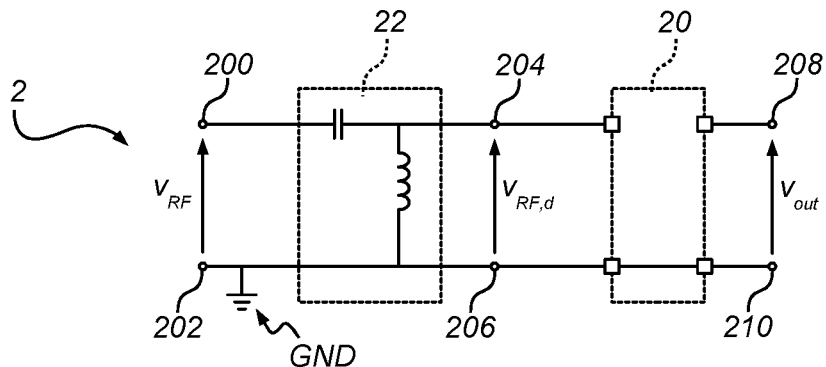
FIG. 2 is a circuit block diagram exemplary of one or more embodiments.

By way of general introduction to the detailed description of exemplary embodiments, reference may be first had to FIG. 2.

FIG. 2 is a circuit block diagram exemplary of a receiver circuit 2 configured for receiving an input RF-modulated signal $v_{RF}$ (e.g., an OOK-modulated signal, for instance with a carrier frequency of 868 MHz) and generating an output signal $v_{out}$ indicative of the envelope of the received signal $v_{RF}$.

It will be noted that explicit indication of time dependency of signals, e.g. in the designations $v_{RF}(t)$ and $v_{out}(t)$, has been dropped for the sake of brevity only.

Specifically, the receiver circuit 2 may comprise a pair of input terminals 200, 202 (i.e., an input port) for receiving an input RF-modulated signal $v_{RF}$, with the (negative) input terminal 202 possibly coupled to a reference voltage terminal, exemplified herein by ground GND. For instance, an RF antenna (not visible in the Figures) may be coupled between terminals 200 and 202.

The receiver circuit 2 may comprise an envelope detection circuit block 20 (e.g., an integrated circuit, IC) having a respective pair of input terminals 204, 206 (i.e., a respective input port) configured to be coupled to the terminals 200, 202 for sensing the received signal $v_{RF}$, and a pair of output terminals 208, 210 (i.e., an output port) for providing an output signal $v_{out}$ indicative of the envelope of signal $v_{RF}$. The (negative) input terminal 206 may be directly coupled to (negative) output terminal 210, e.g. in order to provide coupling of terminal 210 to ground GND.

In one or more embodiments, an envelope detection circuit block 20 may comprise a single negative terminal 206/210, e.g. in the form of a single GND pin/pad of an integrated circuit 20.

Optionally, the receiver circuit 2 may comprise a matching network circuit block 22 coupled between the input port 200, 202 of the receiver circuit 2 and the input port 204, 206 of the envelope detection circuit block 20, e.g. for providing impedance matching of the receiver circuit 2 to an RF antenna coupled thereto.

A matching network circuit block 22 as exemplified in FIG. 2 may comprise off-chip components (i.e., components external to the integrated circuit 20) such as a capacitor coupled between terminals 200 and 204 and an inductor coupled between terminals 204 and 206. Terminal 202 may be directly coupled to terminal 206, e.g. in order to provide coupling of terminal 206 to ground GND. Generally, impedance matching networks are known in the art, so that a more detailed description will not be provided herein.

The signal $v_{RF,d}$ provided at the output port 204, 206 of the matching network circuit block 22 may thus be substantially similar to the signal $v_{RF}$ received at the input port 200, 202, and the two designations $v_{RF,d}$ and $v_{RF}$ may be used equally in the context of the present description.

It is noted that both documents by P. Wang et al. (2017 and 2018, already cited) disclose the design of a wake-up receiver (WuRX) comprising an off-chip (i.e., external) impedance transformation network and an active envelope detector circuit.

Similarly, N. Roberts et al. (already cited) discloses a CMOS low power wake-up radio using two off-chip components (an inductor and a capacitor).

The devices disclosed in P. Wang et al. and N. Roberts et al. are adapted to de-modulate signals with OOK modulation, comprise metal-oxide semiconductor (MOS) field-effect transistors (FETs) working in sub-threshold regime and involve external matching networks. In such devices, the envelope extraction process exploits the exponential sub-threshold characteristics of the MOSFETs, wherein second-order non-linearities may result in an envelope-dependent part of the current at baseband, e.g. having a frequency similar to the frequency of the digital signal $V_{OOK}$.

The devices disclosed in P. Wang et al. (2018) and N. Roberts et al. both detect envelopes of an input signal $v_{RF}$, and feature a common-source topology at the input stage. Disadvantageously, such devices employ dynamic threshold MOS transistors (DTMOS), which are not implemented in standard CMOS fabrication processes.

Additionally, both documents by P. Wang et al. (2017 and 2018) propose a complex structure for providing biasing of the envelope detector circuit.

N. Roberts et al. propose a differential envelope detector circuit, which has the drawback of requiring several steps to reduce the effects of mismatch between corresponding transistors in the two branches, including independently biasing the two branches in the case of high offset.

P. Wang et al. (2017) propose a pseudo-differential common-gate structure relying on current reuse, which requires a complex structure to allow setting a correct DC operating point despite possible PVT variations perturbing the nominal operating point.

It is also noted that Y. Wang et al. (already cited) discloses a circuit for extracting digital bits from a received RF signal by detecting falling edges of the respective envelope signal. Also the device disclosed by Y. Wang et al. is adapted to de-modulate signals with OOK modulation, comprises MOS field-effect transistors working in sub-threshold regime and involves an external matching network. Operation of such device is based on a comparison between the leakage current of a MOSFET and a reference current. However, the Inventors have noted that the circuit disclosed by Y. Wang et al. requires complex calibration and only detects falling edges of the envelope of the received signal $v_{RF}$.

Additionally, none of the arrangements discussed above provides the possibility of adapting the envelope detection circuit to different bit rates of the digital signal $V_{OOK}$, e.g. in case the bit rate of signal $V_{OOK}$ is higher than the cut-off frequency of the envelope detection circuit.

In order to provide improved envelope detection, various embodiments of the present description relate to envelope edge detection circuits 20 as exemplified in FIGS. 3 to 8.

Throughout the figures annexed herein, like parts or elements are indicated with like references/numerals and a corresponding description will not be repeated for brevity.

Figure 3:
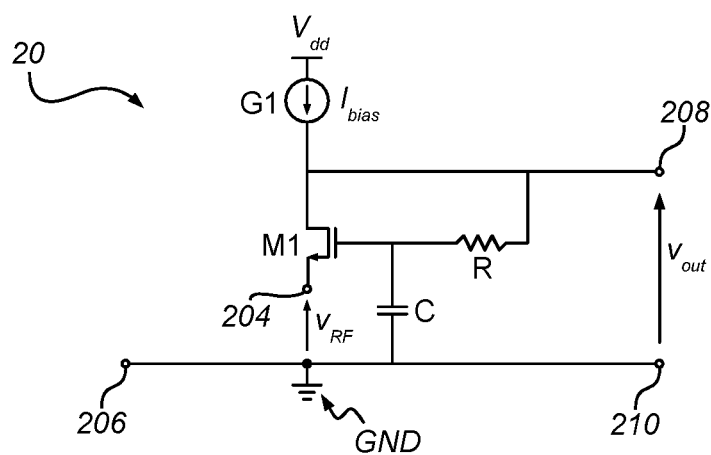
FIGS. 3 to 8 are circuit diagrams exemplary of implementation details of embodiments.

FIG. 3 is a circuit diagram exemplary of possible implementation details of an envelope edge detection circuit 20.

As previously described, an envelope edge detection circuit 20 may comprise an input port 204, 206 for receiving a RF-modulated signal $v_{RF}$, and an output port 208, 210 for providing an output signal $v_{out}$ indicative of the envelope of the received signal $v_{RF}$, in particular indicative of the edges of said envelope.

The (negative) terminals 206 and 210 may be (directly) coupled to provide a common reference or ground GND. In one or more embodiments, e.g. in case the circuit 20 comprises an integrated circuit, a single ground pin/pad may be provided in place of terminals 206, 210, the single ground pin/pad providing a voltage reference for both input and output signals.

As exemplified in FIG. 3, the circuit 20 may be configured to provide a first current path (G1, M1) between a power supply rail $V_{dd}$ (e.g., at 1.2 V) and the reference terminal GND, the first current path comprising the input terminals 204 and 206.

The first current path may comprise a first transistor M1 (e.g., a MOS transistor) coupled in series to a first bias source G1 (e.g., a current generator whose architecture is known per se) which provides a current $I_{bias}$ for biasing the transistor M1. For instance, the bias source G1 may be coupled between the power supply rail $V_{dd}$ and the drain terminal of the MOS transistor M1, and the MOS transistor M1 may have its source terminal coupled to the input terminal 204 to receive the input RF-modulated signal $v_{RF}$, thereby providing a common-gate input stage of the circuit 20.

It will be noted that, despite not being visible in FIG. 3 (as well as FIGS. 4 to 8), a current path may be provided between terminals 204 and 206 externally to the circuit 20. In fact, external circuitry coupled at the input port 204, 206 of an envelope edge detection circuit 20 (e.g., a RF antenna coupled between terminals 200 and 202, possibly with a matching network circuit block 22) may be modeled as an equivalent RF voltage source coupled between terminals 204 and 206, so that a current (e.g., the biasing current $I_{bias}$) may flow through terminal 204.

In one or more embodiments as exemplified in FIG. 3, the output terminal 208 may be coupled to a node in the first current path intermediate the first transistor M1 and the first bias source G1, and a feedback network may be provided between the output terminal 208 and a control terminal (e.g., the gate terminal) of transistor M1. For instance, the feedback network may comprise an RC network including a resistor R coupled between the output terminal 208 and the gate of transistor M1, and a capacitor C coupled between the gate of transistor M1 and ground GND.

Figure 4:
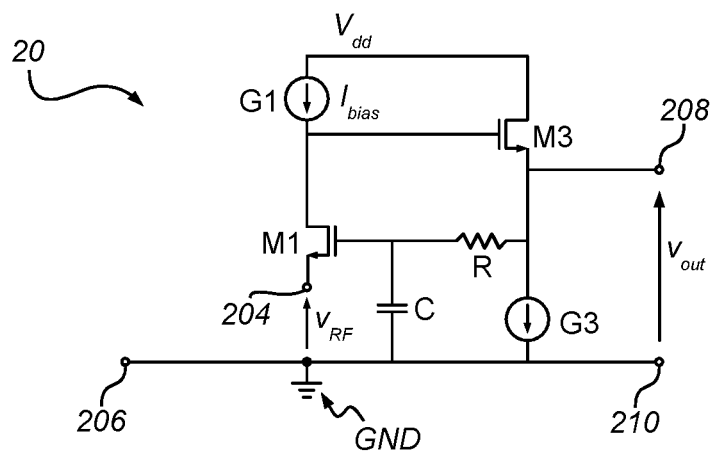

Additionally, in one or more embodiments as exemplified in FIG. 4, an envelope edge detection circuit 20 may be configured to provide a second current path (M3, G3) between the power supply rail $V_{dd}$ and the reference terminal GND, the second current path comprising the output terminal 208.

Specifically, the second current path may comprise a second transistor M3 (e.g., a MOS transistor) coupled in series to a second bias source G3, with the bias source G3 biasing the transistor M3. For instance, the transistor M3 may have its current path coupled between the power supply rail $V_{dd}$ (e.g., at the drain of MOS transistor M3) and the output terminal 208 (e.g., at the source of MOS transistor M3), and the bias source G3 may be coupled between the output terminal 208 and the reference terminal GND.

As exemplified in FIG. 4, a control terminal (e.g., a gate terminal in case of MOS transistors) of transistor M3 may be (directly) coupled to a node in the first current path intermediate the first transistor M1 and the first bias source G1 (e.g., the drain terminal of transistor M1), and the output terminal 208 may be coupled to a node in the second current path intermediate the second transistor M3 and the second bias source G3.

Figure 5:
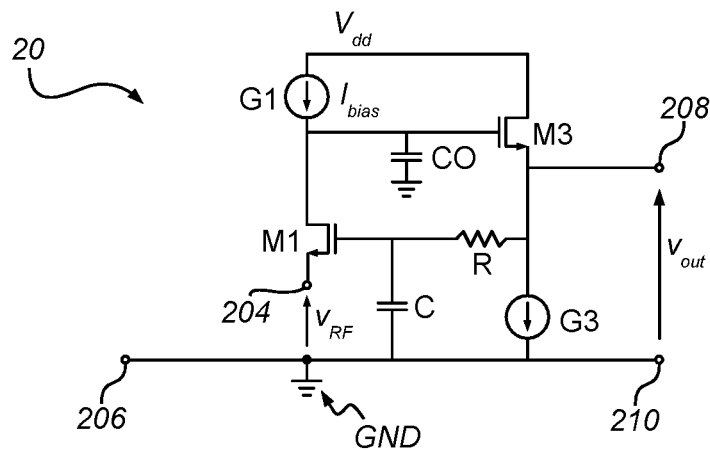

Additionally or alternatively, in one or more embodiments as exemplified in FIG. 5, an envelope edge detection circuit 20 may comprise a second capacitor CO coupled between the control terminal of transistor M3 and the reference terminal GND, with the second capacitor CO providing the possibility of tuning and/or adjusting the transfer function of the circuit 20, e.g. with the frequency of one or more poles (e.g., a second pole) in said transfer function being dependent on the value of capacitance of said second capacitor CO.

Figure 6:
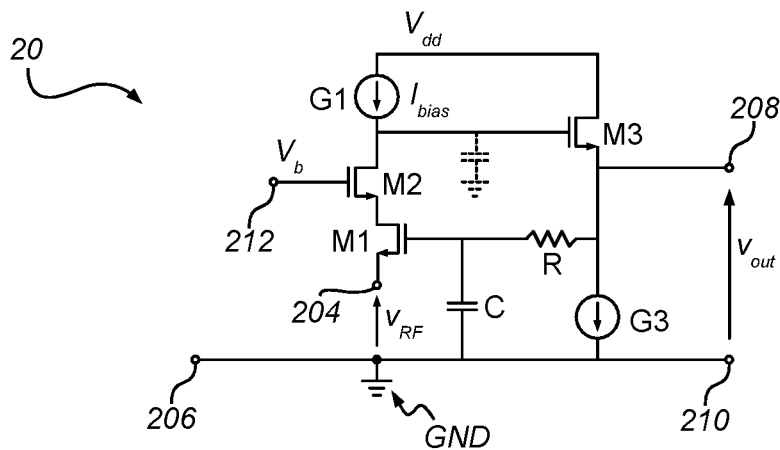

Additionally or alternatively, in one or more embodiments as exemplified in FIG. 6, an envelope edge detection circuit 20 may provide increased gain of the common-gate input stage by substituting the transistor M1 with a cascoded common-gate arrangement of two transistors M1 and M2.

The additional transistor M2 may be coupled between the transistor M1 and the bias source G1, e.g. with the source terminal of transistor M2 (directly) coupled to the drain terminal of transistor M1 and the drain terminal of transistor M2 coupled to the output terminal 208 (in embodiments which do not comprise the second transistor M3) or to the gate terminal of M3 (in embodiments which comprise the second transistor M3) to provide thereto an amplified signal.

As exemplified in FIG. 6, the transistor M2 may be biased by coupling a respective control terminal 212 (e.g., a gate terminal) to a DC bias voltage $V_b$, which can be generated with a variety of different circuit arrangements.

Figure 7:
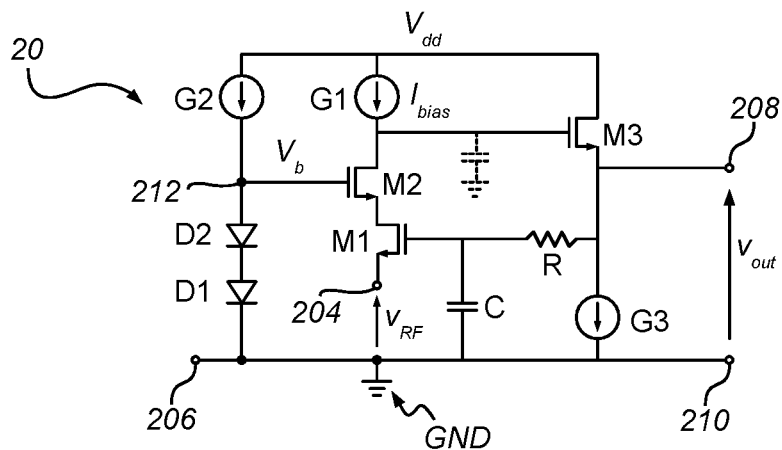

For instance, in one or more embodiments as exemplified in FIG. 7, the control terminal 212 of transistor M2 may be coupled to an intermediate node of a third current path (G2, D2, D1) between the power supply rail $V_{dd}$ and the reference terminal GND.

In particular, the third current path may comprise a third bias source G2 coupled between the power supply rail $V_{dd}$ and the control terminal of transistor M2, and a set of p-n junctions (e.g., two diodes D1, D2) coupled in series between the control terminal of transistor M2 and the reference terminal GND, with the p-n junctions D1, D2 being conductive from the control terminal of transistor M2 to the reference terminal GND.

Figure 8:
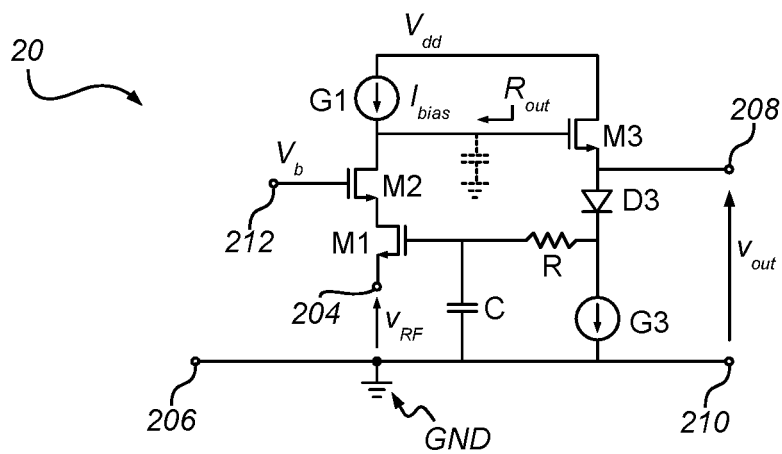

Additionally or alternatively, in one or more embodiments as exemplified in FIG. 8, a further p-n junction D3 may be coupled between the source terminal of transistor M3 and the second bias source G3. The p-n junction D3 may thus provide a voltage shift at the source terminal of transistor M3 in order to facilitate correct biasing of the output node of the input stage of circuit 20, i.e. the drain of transistor M1 (e.g., in the case of the single-transistor input stage exemplified in FIGS. 4 and 5) or the drain of transistor M2 (e.g., in the case of the cascode arrangement M1+M2 exemplified in FIGS. 6, 7 and 8).

In one or more embodiments, any of the bias sources G1, G2 and G3 may comprise respective current generators (whose architecture is known per se, e.g. including current mirrors) and/or biasing resistors.

In one or more embodiments, p-n junctions (e.g., any of the p-n junctions D1, D2, D3) may be implemented with diodes and/or diode-connected transistors, so that the term "p-n junction" may be used to indicate both diodes and diode-connected transistors.

It will be appreciated that an envelope edge detection circuit 20 as exemplified in any of FIGS. 3 to 8 may be implemented with standard CMOS fabrication processes.

It will be appreciated that, despite referring to MOS transistors M1, M2, M3 throughout the present description, one or more embodiments may comprise other types of transistors, e.g. BJT transistors. Of course, reference to "gate", "source" and "drain" terminals used herein may vary accordingly, e.g. to read "base", "emitter" and "collector" respectively.

In the following, large-signal response of an exemplary embodiment of an envelope edge detection circuit 20, e.g. as exemplified in FIG. 8, is discussed.

One or more embodiments may involve operating the transistor M1 in the input stage of circuit 20 in a so-called sub-threshold regime, e.g. with a biasing current $I_{bias}$ in the order of some nA (1 nA=$10^{-9}$ A), so that transistor M1 may have an exponential current-voltage characteristic, whereby the transistor current may be exponentially dependent on the gate-source voltage applied thereto.

Additionally, in one or more embodiments also transistors M2 and/or M3 may operate in sub-threshold regime, e.g. for power saving purposes.

Thus, as a result of a signal $v_{RF}(t)$ according to equation 1 being received between input terminals 204 and 206 and given that at radio frequency the gate of M1 may be grounded by capacitor C, the current I(t) flowing through transistor M1 which operates in sub-threshold regime may be computed according to the following equation:

$$I(t) = I_{bias} \cdot e^{-\frac{v_{RF}(t)}{n \cdot V_T}} \approx I_{bias} \cdot \left[1 - \frac{v_{RF}(t)}{n \cdot V_T} + \frac{1}{2}\left(\frac{v_{RF}(t)}{n \cdot V_T}\right)^2\right] \quad (2)$$

wherein $V_T$ is the thermal voltage and n is the ideality factor of transistor M1.

The radio-frequency component of the current I(t) may be filtered out as it is out-of-band. Therefore, the average current I at the drain of transistor M1 (e.g., the cascode current) may be computed according to the following equation (by recalling also equation 1):

$$I(t) \approx I_{bias} \cdot \left[1 + \frac{V_{OOK}^2(t)}{4 \cdot n^2 \cdot V_T^2}\right] = I_{bias} + \Delta I(t) \quad (3)$$

As exemplified in equation 3, the average current flowing in the transistor M1 (and thus in the cascode arrangement M1, M2 if present) may vary depending on the value of the digital signal $V_{OOK}$. For instance, as a result of the digital signal $V_{OOK}$ having a low logic value (e.g., 0 V), the current increase $\Delta I(t)$ may be equal to zero, and as a result of the digital signal $V_{OOK}$ having a high logic value (e.g., $V_{dd}$), the current increase $\Delta I(t)$ may be different from zero.

Therefore, in one or more embodiments, receiving an OOK-modulated signal $v_{RF}$ at terminals 204, 206 may generate an increase in the average current flowing in the transistor M1 (and thus in the cascode arrangement M1, M2 if present) as a result of the signal $v_{RF}$ including the carrier wave, i.e. as a result of the digital signal $V_{OOK}$ having high logic value. Such operation may be modeled with an equivalent low-frequency voltage source $v_{IN}(t)$ coupled between terminals 204 and 206, having a value which may be computed according to the following equation:

$$v_{IN}(t) = \frac{\Delta I(t)}{g_m} = \frac{I_{bias} \cdot V_{OOK}^2(t)}{4 \cdot n^2 \cdot V_T^2} \cdot \frac{1}{g_m} = \frac{V_{OOK}^2(t)}{4 \cdot n \cdot V_T} \quad (4)$$

wherein $g_m$ is the transconductance of transistor M1 (whose value is equal to $I_{bias}/nV_T$ when M1 operates in sub-threshold regime).

Therefore, one or more embodiments may rely on second-order non-linearity of sub-threshold operation for extracting digital information of signal $V_{OOK}$ from a received signal $v_{RF}$.

As anticipated, in one or more embodiments an envelope edge detection circuit 20 may have a band-pass response, with peaks generated in the output signal $v_{out}$ as a result of detection of a change in the input signal $v_{RF}$ due to a change in the value of the digital signal $V_{OOK}$.

In particular, the band-pass response of circuit 20 may be centered around the bit rate of the digital signal $V_{OOK}$, so that variations of the low-frequency signal $v_{IN}(t)$ (corresponding to variations of the value of the digital signal $V_{OOK}$) may result in peaks in the output signal $v_{out}$.

The amplitude $A_{out\_peak}$ of such peaks in the output signal $v_{out}$ may be computed according to the following equations:

$$A_{out\_peak} = G_{RECT} \cdot A_{RF,in} \quad (5)$$

$$G_{RECT} = \frac{g_m \cdot R_{out} \cdot A_{RF,in}}{4 \cdot n \cdot V_T} \quad (6)$$

wherein $g_m$ is the transconductance of transistor M1 and $R_{out}$ is the output impedance of the cascode arrangement M1+M2 at the drain terminal of transistor M2 (i.e., the impedance which is "seen" at the gate terminal of transistor M3 towards the cascode arrangement M1+M2 assuming the impedance of the bias source G1 to be much higher, as exemplified in FIG. 8).

Small-signal response of an envelope edge detection circuit 20 as exemplified in FIG. 8 may be described according to the following equations:

$$\frac{v_{out}}{v_{IN}} = \frac{1 + sR\prime C}{\left(1 + s\frac{R\prime C}{g_m R_{out}}\right) \cdot (1 + sR_{out}C\prime)} \quad (7)$$

$$R' = R + R_{out}^{foll} \quad (8)$$

wherein $R_{out}^{foll}$ is the output impedance of transistor M3 and C' is the value of capacitance at the output node of the cascode arrangement M1+M2, which may include parasitic capacitances and, optionally, the capacitance of capacitor CO if present (as exemplified with solid lines in FIG. 5, and with dotted lines in FIGS. 6 to 8).

Figure 9:
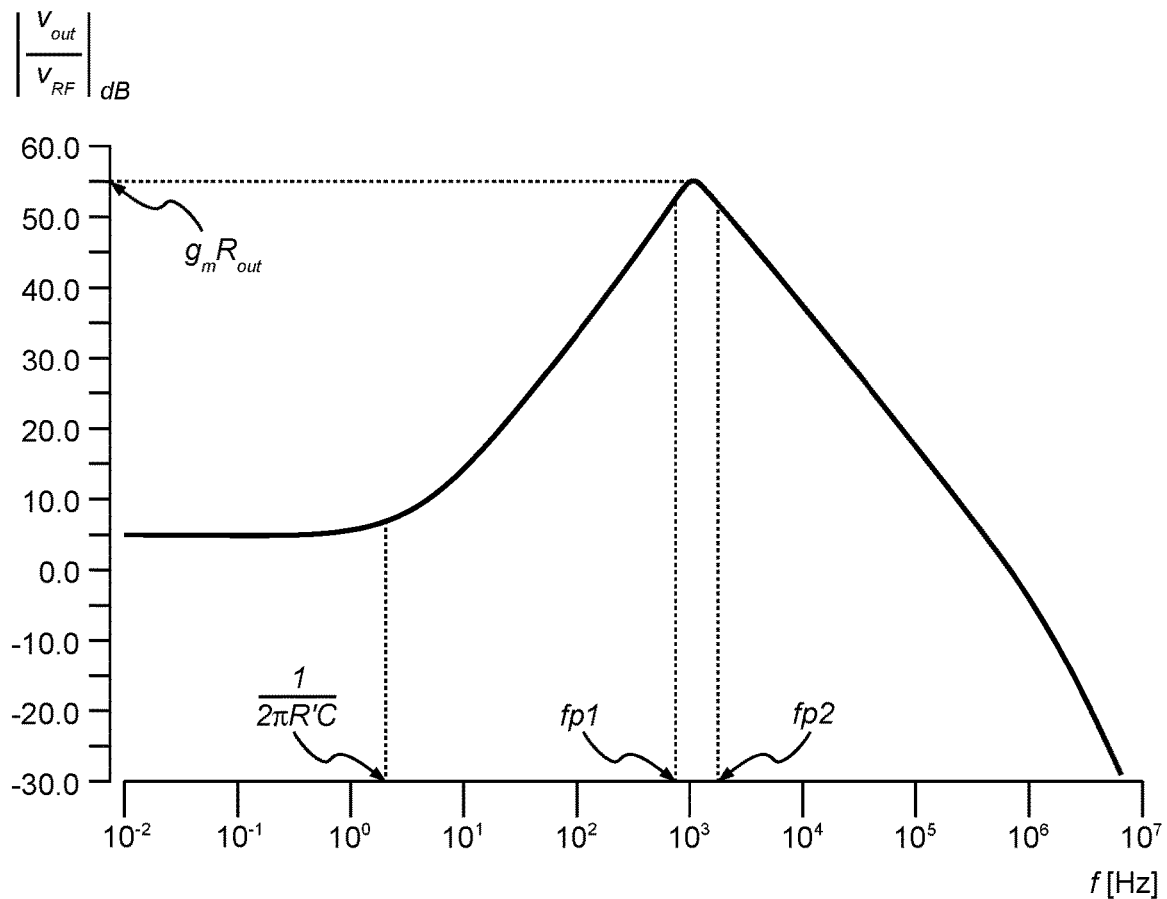
FIG. 9 is exemplary of possible frequency response of one or more embodiments.

FIG. 9 is exemplary of a possible frequency response (e.g., a transfer function) of a circuit 20 as exemplified in FIG. 8.

As exemplified in FIG. 9, band-pass response of an envelope edge detection circuit 20 may thus be centered around the operating bit rate (frequency) of the digital signal $V_{OOK}$, which may be, for instance, around 1 kbit/s (corresponding to a frequency of 1 kHz=$10^3$ Hz).

In one or more embodiments, a transfer function (e.g., equation 7 above) of an envelope edge detection circuit 20 may comprise a pair of poles at respective frequencies fp1, fp2 close to the band center frequency, e.g. to reduce noise bandwidth.

Frequencies fp1, fp2 may be computed according to:

$$fp1 = \frac{g_m R_{out}}{2\pi R\prime C}$$

$$fp2 = \frac{1}{2\pi R_{out} C\prime}$$

Figure 10:
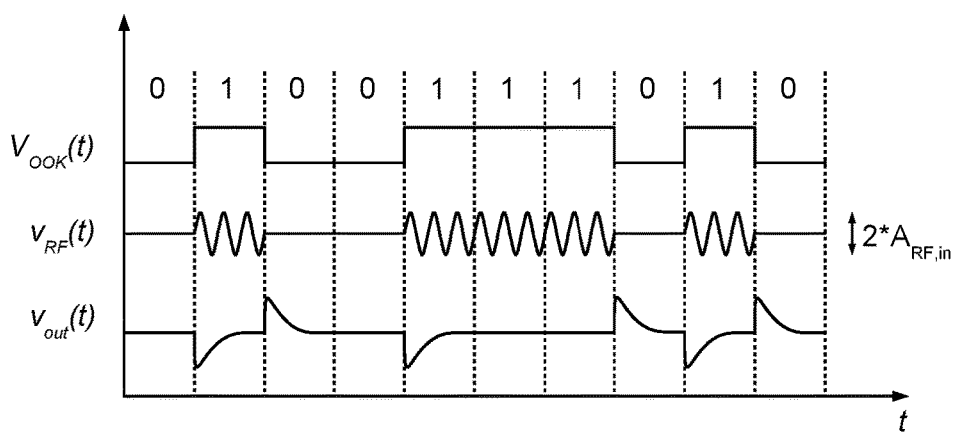
FIG. 10 is exemplary of possible time behavior of signals in embodiments.

Therefore, an envelope edge detection circuit 20 may operate according to the signals exemplified in FIG. 10.

Figure 1:
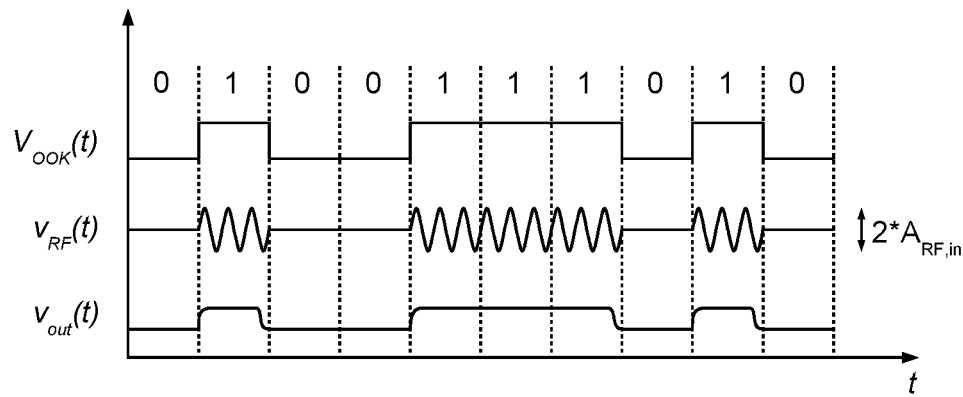
FIG. 1 has been described in the foregoing.

In FIG. 10, signals $V_{OOK}$ and $v_{RF}$ are illustrated, corresponding to the same signals exemplified in FIG. 1. Signal $v_{out}$ of FIG. 10 is exemplary of an output signal as generated by one or more embodiments according to any of FIGS. 3 to 8 as a result of signal $v_{RF}$ being received at terminals 204, 206.

It is noted that, advantageously with respect to known solutions, the output signal $v_{out}$ may be indicative of both rising and falling edges of the envelope of signal $v_{RF}$. As exemplified herein, the output signal $v_{out}$ may thus comprise a negative spike as a result of a rising edge of the digital signal $V_{OOK}$, and a positive spike as a result of a falling edge of the digital signal $V_{OOK}$, thereby facilitating extraction of digital information from the OOK-modulated signal $v_{RF}$.

In one or more embodiments, the band center frequency (e.g., fp1 to fp2) of an envelope edge detection circuit 20 may be tunable and/or adjustable in order to be adaptable to different bit rates (frequencies) of signal $V_{OOK}$. For instance, in order to shift the band center frequency to adapt to a new bit rate $BR_{new}$ of signal $V_{OOK}$, the magnitude of the biasing current $I_{bias}$ may be increased (e.g., multiplied) by a certain factor k and the capacitance of capacitor C may be decreased (e.g., divided) by the same factor k, wherein the factor k may be computed according to the following equation:

$$k = \frac{BR_{new}}{1 \text{ kHz}} \quad (9)$$

For instance, in one or more embodiments the bias source G1 may comprise a plurality of transistors coupled in parallel (not visible in the Figures annexed herein) and activatable in different sets so to facilitate "modulating" the magnitude of the biasing current $I_{bias}$. Additionally or alternatively, in one or more embodiments the capacitor C may comprise a bank of switchable capacitors so to facilitate modulating the magnitude of the capacitance.

In one or more embodiments, a certain root-mean-square (RMS) output noise $v_{RMS,out}$ may be defined at the output terminals 208, 210, e.g. due to the thermal noise of transistor M1 and bias source G1.

Thus, an equivalent noise $v_{RMS,eq,in}$ at the input terminals 204, 206 of circuit 20 (i.e., a RMS output noise referred to the input) may be computed according to the following equation:

$$\frac{v_{RMS,out}}{G_{RECT}(A_{RF,in})} = v_{RMS,eq,in} \quad (10)$$

wherein $G_{RECT}$ can be computed according to equation 6 previously presented.

As a result of the input signal-to-noise ratio $SNR_{in}$ being defined according to equation 11 here below:

$$SNR_{in} = \frac{A_{RF,in}}{v_{RMS,eq,in}} \quad (11)$$

the minimum detectable peak amplitude $A_{RF,in}$ (i.e., the sensitivity) may be computed according to the following equation:

$$A_{RF,in} = \sqrt{\frac{SNR_{in} \cdot v_{RMS,out} \cdot 4 \cdot n \cdot V_T}{g_m R_{out}}} \quad (12)$$

Therefore, in one or more embodiments, a MOS transistor M1, biased via a bias source G1, may be configured to receive an input signal $v_{RF}$ at its source terminal and to propagate an amplified signal at its drain terminal, with the propagated signal being indicative of low-frequency variations of the input signal $v_{RF}$ (i.e., indicative of the envelope of signal $v_{RF}$).

In one or more embodiments, the signal provided at the drain terminal of transistor M1 may be propagated at the gate terminal of transistor M3 (possibly after amplification via a further transistor M2 cascoded to M1), which is biased via a bias source G3 and configured in a common-drain topology to provide at the output terminal 208 an output signal $v_{out}$ indicative of the envelope of signal $v_{RF}$.

In one or more embodiments as exemplified in any of FIGS. 3 to 8, the negative feedback network R, C between the output terminal 208 and the gate of transistor M1 may facilitate correct setting of the DC operating point of the transistor M1 (possibly cascoded with transistor M2) and self-biasing of the circuit.

At high frequencies (e.g., radio frequency), the feedback loop between the output terminal 208 and the gate of transistor M1 may not be closed.

In one or more embodiments as exemplified in any of FIGS. 3 to 8, the envelope edge detection circuit 20 may have a band-pass behavior, which may facilitate reducing noise in the output signal $v_{out}$ and AC-coupling to subsequent stages.

One or more embodiments advantageously provide the possibility of adapting (e.g., programming and/or tuning) the frequency behavior of an envelope edge detection circuit 20 to different bit rates of digital signal $V_{OOK}$, e.g. varying the magnitude of $I_{bias}$ and C.

One or more embodiments may also provide robust operation with respect to PVT variations.

Therefore, one or more embodiments may provide a circuit 20 for detecting edges of the envelope of an ASK-modulated analog signal (e.g., OOK-modulated), which may be advantageously used, for instance, in an input block of an always-ON nano-Watt Wake-Up radio, e.g. for short range communication.

It will otherwise be appreciated that such exemplary context of use of one or more embodiments does not limit the extent of protection. One or more embodiments may be applied at the physical layer of any ultra-low power RF communication system based on edge detection.

As exemplified herein, a circuit (e.g., 20) may comprise:
an input node (e.g., 204) configured to receive an input analog signal (e.g., $v_{RF}$) resulting from amplitude modulation of a radio-frequency carrier by a digital signal (e.g., $V_{OOK}$),
an output node (e.g., 208) configured to provide an output signal (e.g., $v_{out}$) indicative of rising and falling edges of an envelope of the input analog signal received, said rising and falling edges being indicative of rising and falling edges of said digital signal, and
a first current path between a power supply node (e.g., $V_{dd}$) and the input node, the first current path comprising at least one first transistor (e.g., M1) having the current path therethrough coupled between the input node and a first bias source (e.g., G1, $I_{bias}$), the first bias source coupled between the at least one first transistor (e.g., directly as exemplified in FIGS. 3 to 5, or via a third transistor M2 as exemplified in FIGS. 6 to 8) and the power supply node.

It will be noted that a current path through a transistor may be, for instance, a drain-source current path (e.g., in the case of MOS transistors) or an emitter-collector current path (e.g., in the case of BJT transistors).

As exemplified herein, the output node may be coupled to a node in the first current path intermediate the at least one first transistor and the first bias source (e.g., directly as shown in FIG. 3, or via a second transistor M3 as shown in FIGS. 4 to 8), and a control terminal of the at least one first transistor may be coupled to the output node via a feedback network (e.g., R, C).

As exemplified herein, a circuit may comprise a second current path between the power supply node and a ground node (e.g., GND), the second current path comprising a second transistor (e.g., M3) having the current path therethrough coupled between the power supply node and the output node and a second bias source (e.g., G3) coupled between the output node (e.g., directly as exemplified in FIGS. 4 to 7, or via a p-n junction D3 as exemplified in FIG. 8) and the ground node.

As exemplified herein, a control terminal of the second transistor may be coupled to said node in the first current path intermediate the at least one first transistor and the first bias source, and the output node may be coupled to a node in the second current path intermediate the second transistor and the second bias source.

As exemplified herein, a circuit may comprise:
a third transistor (e.g., M2) in the first current path, the third transistor having the current path therethrough coupled between the at least one first transistor and the first bias source (e.g., in a cascoded arrangement or "cascoded" to the at least one first transistor),
wherein said node in the first current path intermediate the at least one first transistor and the first bias source is located intermediate the third transistor and the first bias source; and
a third bias source (e.g., $V_b$; G2, D1, D2) of the third transistor coupled to a control terminal (e.g., 212) of the third transistor.

As exemplified herein, a control terminal of the second transistor may be coupled to said node in the first current path intermediate the third transistor and the first bias source, and the output node may be coupled to a node in the second current path intermediate the second transistor and the second bias source.

As exemplified herein, the feedback network may comprise a low-pass network or a band-pass network coupled between the output node and the control terminal of the at least one first transistor.

As exemplified herein, the first bias source and/or the second bias source and/or the third bias source may comprise current generators and/or resistors.

As exemplified herein, a circuit may comprise a p-n junction (e.g., D3) in the second current path, the p-n junction coupled between the output node and the second bias source and conductive from the output node towards the second bias source, and the feedback network may be coupled between the p-n junction and the control terminal of the at least one first transistor.

As exemplified herein, p-n junctions may comprise diodes or diode-connected transistors.

As exemplified herein, the transistors may be metal-oxide-semiconductor (MOS) transistors with respective control terminals being gate terminals, and at least the at least one first transistor may be configured to operate in sub-threshold regime.

As exemplified herein, the feedback network may comprise a capacitive component (e.g., C) and/or a resistive component (e.g., R). The value of a current (e.g., $I_{bias}$) provided by the first bias source, and/or the value of the capacitive component and/or the value of the resistive component may be adjustable as a function of a bit rate of said digital signal. For instance, such value(s) may be adjusted so to provide a low-pass or a band-pass response of the feedback network centered around the bit rate (e.g., the frequency) of said digital signal.

As exemplified herein, an electronic device may comprise:
 a circuit according to one or more embodiments, and
 a radio-frequency antenna coupled to the input node of the circuit for receiving an input analog signal resulting from amplitude modulation of a radio-frequency carrier by a digital signal.

As exemplified herein, an electronic device may comprise an impedance matching network (e.g., 22) coupled between the radio-frequency antenna and the input node of the circuit.

As exemplified herein, a method of operating a circuit according to one or more embodiments or an electronic device according to one or more embodiments may comprise:
 receiving at an input node of said circuit an input analog signal resulting from amplitude modulation of a radio-frequency carrier by a digital signal,
 operating at least said at least one first transistor in the circuit in sub-threshold regime, and
 reading at said output node of the circuit an output signal indicative of rising and falling edges of the envelope of the input analog signal received.

As exemplified herein, a method may comprise selecting a value of a current provided by said first bias source in the circuit and the value of said capacitive component in the circuit as a function of a bit rate of said digital signal, preferably increasing the value of said current and decreasing the value of said capacitive component as a function of said bit rate of said digital signal. For instance, the value of said current may be increased and the value of said capacitive component may be decreased proportionally to said bit rate of said digital signal.

Without prejudice to the underlying principles, the details and embodiments may vary, even significantly, with respect to what has been described by way of example only, without departing from the extent of protection.

The extent of protection is defined by the annexed claims.

What is claimed is:

1. A circuit comprising:
 a first node configured to receive an analog signal that is an amplitude modulated radio-frequency signal for a digital signal;
 an output node configured to provide an output signal indicative of rising and falling edges of an envelope of the analog signal, the rising and falling edges being indicative of rising and falling edges of the digital signal; and
 a first current path between a power supply node and the first node, the first current path comprising a first transistor coupled between the first node and a first bias source, the first bias source coupled between the first transistor and the power supply node, wherein:
  the output node is coupled to a first intermediate node in the first current path between the first transistor and the first bias source, and
  a control terminal of the first transistor is coupled to the output node via a feedback network, wherein the circuit is an edge detection circuit comprising an input with the first node and an output with the output node.

2. The circuit of claim 1, further comprising:
 a further transistor in the first current path, the further transistor coupled between the first transistor and the first bias source, wherein the first intermediate node in the first current path is located between the further transistor and the first bias source.

3. The circuit of claim 1, wherein the feedback network comprises a low-pass network coupled between the output node and the control terminal of the first transistor.

4. The circuit of claim 1, wherein the first bias source comprises a current generator.

5. The circuit of claim 1, wherein the first transistor is a metal-oxide-semiconductor (MOS) transistor and the control terminal of the first transistor is a gate terminal, and wherein the first transistor is configured to operate in sub-threshold regime.

6. The circuit of claim 1, wherein the feedback network comprises a capacitor, and wherein the value of a current provided by the first bias source and the capacitance value of the capacitor are adjustable as a function of a bit rate of the digital signal.

7. The circuit of claim 1, further comprising
 a second current path between the power supply node and a ground node, the second current path comprising a second transistor coupled between the power supply node and the output node and a second bias source coupled between the output node and a ground node, wherein:
 a control terminal of the second transistor is coupled to the first intermediate node in the first current path, and
 the output node is coupled to a second intermediate node in the second current path between the second transistor and the second bias source.

8. The circuit of claim 7, wherein a control terminal of the second transistor is coupled to the first intermediate node in the first current path.

9. The circuit of claim 7, wherein the second bias source comprise a current generator.

10. The circuit of claim 7, comprising:
a third transistor in the first current path, the third transistor coupled between the first transistor and the first bias source, wherein the first intermediate node in the first current path is located between the third transistor and the first bias source; and
a third bias source coupled to a control terminal of the third transistor.

11. The circuit of claim 10, wherein the third bias source comprises a current generator.

12. The circuit of claim 7, further comprising:
a p-n junction in the second current path, the p-n junction coupled between the output node and the second bias source and conductive from the output node towards the second bias source, wherein the feedback network is coupled between the p-n junction and the control terminal of the first transistor.

13. The circuit of claim 12, wherein the p-n junction comprises a diode.

14. The circuit of claim 12, wherein the p-n junction comprises a diode-connected transistor.

15. An electronic device comprising:
a radio-frequency antenna;
an edge detection circuit comprising an input with a first node and an output with an output node, the radio-frequency antenna being coupled to the first node, the radio-frequency antenna configured to receive an analog signal that is an amplitude modulated radio-frequency signal for a digital signal;
the output node being configured to provide an output signal indicative of rising and falling edges of an envelope of the analog signal, the rising and falling edges being indicative of rising and falling edges of the digital signal; and
a first current path between a power supply node and the first node, the first current path comprising a first transistor coupled between the first node and a first bias source, the first bias source coupled between the first transistor and the power supply node, wherein:
the output node is coupled to a first intermediate node in the first current path between the transistor and the first bias source, and
a control terminal of the first transistor is coupled to the output node via a feedback network.

16. The electronic device of claim 15, further comprising:
an impedance matching network coupled between the radio-frequency antenna and the first node.

17. A method of operating an electronic device, the method comprising:

receiving, at a first node of an edge detection circuit, an analog signal that is an amplitude modulated radio-frequency signal for a digital signal;
having a current flow in a first current path between a power supply node and the first node, the first current path comprising a first transistor coupled between the first node and a first bias source, the first bias source coupled between the first transistor and the power supply node,
operating the first transistor in sub-threshold regime in which a current flowing through the first transistor is exponentially dependent on a gate-source voltage applied to the first transistor; and
reading, at an output node of the edge detection circuit, an output signal indicative of rising and falling edges of an envelope of the analog signal, wherein the output node is coupled to a first intermediate node in the first current path between the transistor and the first bias source, and wherein a control terminal of the first transistor is coupled to the output node via a feedback network.

18. The method of claim 17, further comprising:
selecting the value of a current provided by the first bias source;
selecting the value of a capacitive component of the feedback network as a function of a bit rate of the digital signal; and
increasing the value of the current and decreasing the value of the capacitive component as a function of the bit rate of the digital signal.

19. The method of claim 17, the method comprising:
adjusting a value of a current provided by the first bias source and a capacitance value of a capacitor in the feedback network as a function of a bit rate of the digital signal.

20. The method of claim 17, the method comprising:
having a current flow in a second current path between the power supply node and a ground node, the second current path comprising a second transistor coupled between the power supply node and the output node and a second bias source coupled between the output node and a ground node, wherein a control terminal of the second transistor is coupled to the first intermediate node in the first current path, and wherein the output node is coupled to a second intermediate node in the second current path between the second transistor and the second bias source.

* * * * *